US008880370B1

(12) United States Patent
Kadambe

(10) Patent No.: US 8,880,370 B1
(45) Date of Patent: Nov. 4, 2014

(54) MULTIPLE SIGNALS DETECTION SYSTEM

(75) Inventor: Shubha L. Kadambe, Cedar Rapids, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 343 days.

(21) Appl. No.: 13/163,351

(22) Filed: Jun. 17, 2011

(51) Int. Cl.
*G06F 17/00* (2006.01)

(52) U.S. Cl.
USPC ............... 702/76; 324/76.12; 702/190

(58) Field of Classification Search
CPC ......... G06F 17/17; G06F 17/00; H04N 17/00; H04N 7/12; H04N 11/04; H04B 17/00; H04B 15/00; H04B 1/10; H04B 17/20; H03M 1/06; H04L 1/00; H04L 27/06; H01T 1/00
USPC ............. 702/76, 126, 69, 190, 66, 70, 71, 73, 702/75, 79, 77, 78, 106, 108, 110, 124, 125, 702/183, 189, 193, 197, 198; 324/76.12, 324/76.15, 76.19, 76.21, 76.22, 76.24, 324/76.29, 76.55, 76.61, 76.33, 76.16; 708/845, 819, 820, 821, 847, 815; 375/224, 286–287, 316, 340
See application file for complete search history.

(56) References Cited

U.S. PATENT DOCUMENTS

| 5,204,677 | A   | * | 4/1993  | Akagiri et al. ............... 341/118 |
|-----------|-----|---|---------|----------------------------------------|
| 6,306,095 | B1  | * | 10/2001 | Holley et al. ................. 600/458 |
| 6,434,515 | B1  | * | 8/2002  | Qian ............................. 702/190 |
| 7,085,711 | B2  |   | 8/2006  | Kadambe                                |
| 7,379,870 | B1  |   | 5/2008  | Belvin et al.                          |
| 7,457,745 | B2  |   | 11/2008 | Kadambe et al.                         |
| 7,478,071 | B2  |   | 1/2009  | Kadambe                                |
| 7,577,548 | B1  |   | 8/2009  | Przytula et al.                        |
| 7,620,529 | B2  |   | 11/2009 | Valley et al.                          |
| 7,813,654 | B1  |   | 10/2010 | Ng et al.                              |
| 7,899,761 | B2  |   | 3/2011  | Kadambe et al.                         |
| 2003/0103589 | A1 | * | 6/2003 | Nohara et al. ............... 375/350  |
| 2007/0033031 | A1 | * | 2/2007 | Zakarauskas ................. 704/233  |
| 2010/0309317 | A1 | * | 12/2010 | Wu et al. ...................... 348/180 |

* cited by examiner

*Primary Examiner* — Eliseo Ramos Feliciano
*Assistant Examiner* — Ruihua Zhang
(74) *Attorney, Agent, or Firm* — Donna P. Suchy; Daniel M. Barbieri

(57) ABSTRACT

Systems, methods, and computer-readable media for detecting signals are provided. A method comprises determining a time-frequency representation for a received signal and partitioning the time-frequency representation of the received signal into a plurality of time-frequency partitions. The method further comprises determining an energy (e.g., a spectral energy) for each of the plurality of time-frequency partitions and detecting one or more signals within the received signal based on the energy (e.g., the mean spectral energy distribution) of the time-frequency partitions. In some embodiments, multiple signals received simultaneously within an input signal may be detected in unknown noise conditions.

21 Claims, 12 Drawing Sheets

MULTIPLE SIGNALS DETECTION SYSTEM

BACKGROUND

The present disclosure relates generally to the field of signal detection.

Various communications systems include components intended to detect the presence of wireless communication signals (e.g., radio frequency, or RF, signals). Such communications systems may be applied in defense (e.g., military communications systems such as electronic warfare systems), commercial (e.g., cellular communications), residential (e.g., wireless home networks), and other realms. For example, in asymmetrical military operations, troops face new RF threats every day that can put them in harms way. In such operations, accurate detection of signals may be an important step in ensuring the safety of troops and the success of operations.

Signal detectors may include energy-based signal detectors and matched filter signal detectors. Energy-based signal detectors may differentiate between actual signals and background noise based on an energy level (e.g., a spectral energy level) of received signals. Energy-based signal detectors often require knowledge of background noise to determine a threshold energy level used to determine the presence of a signal. In order to obtain this knowledge, energy-based signal detectors may need to monitor background noise for an extended period of time. Matched filter based detectors may be optimal if all of the signal parameters and noise statistics associated with signals being received are known a priori. It is not practical to obtain a priori knowledge of all relevant signal parameters and noise statistics for many systems. Further, such knowledge is unavailable for new and previously unknown signals (e.g., new threats). Both energy-based signal detectors and matched filter signal detectors are typically limited to detecting a single signal at a time. Accordingly, such systems are incapable of handling detection of multiple threats that are present at the same time. Thus, there is a need for a computationally, inexpensive, real time signal detector that can detect signals present in unknown noise. Further, there is a need for a system for and a method of detecting multiple signals simultaneously irrespective of bandwidth and center frequencies.

SUMMARY

One embodiment of the disclosure relates to a method of detecting signals. The method comprises determining a time-frequency representation for a received signal and partitioning the time-frequency representation of the received signal into a plurality of time-frequency partitions. The method further comprises determining an energy (e.g., a spectral energy) for each of the plurality of time-frequency partitions and detecting one or more signals within the received signal based on the distribution of spectral energy across the time-frequency partitions.

Another embodiment of the disclosure relates to a system for detecting signals. The system comprises a signal conversion module configured to receive an input signal and calculate a time-frequency representation for the input signal. The signal conversion module is configured to divide the time-frequency representation into a plurality of time-frequency atoms. Each time-frequency atom has a frequency range and a time range associated therewith. The system further comprises an analysis module configured to determine a spectral energy for each of the plurality of time-frequency atoms and detect one or more signals within the input signal based on the spectral energy distribution across the time-frequency atoms.

Another embodiment of the disclosure relates to one or more computer-readable media having instructions stored thereon that, when executed by a processor, are configured to perform a method of detecting signals. The method comprises determining a time-frequency representation for a received signal and partitioning the time-frequency representation of the received signal into a plurality of time-frequency atoms. The method further comprises determining a spectral energy for each of the plurality of time-frequency atoms. The method further comprises calculating a mean spectral energy distribution for the time-frequency atoms across a range of frequencies. The method further comprises estimating a probability distribution for one or more energy ranges based on the mean spectral energy distribution. The probability distribution represents an estimated probability for each of the one or more energy ranges that the spectral energy of a time-frequency atom will fall within the respective energy range. The method further comprises determining a minimum energy threshold based on the probability distribution and detecting one or more signals within the received signal based on the minimum energy threshold.

BRIEF DESCRIPTION OF THE DRAWINGS

The exemplary embodiments will become more fully understood from the following detailed description, taken in conjunction with the accompanying drawings, wherein like reference numerals refer to like elements, in which.

DETAILED DESCRIPTION

Referring generally to the figures, systems and methods for detecting one or more signals that may be present in a signal received by a node (e.g., a radio) are described according to various exemplary embodiments. Various embodiments disclosed herein convert a received signal into a two dimensional time-frequency representation or distribution. The time-frequency distribution may be split or divided into a plurality of time-frequency atoms (e.g., rectangular partitions), such that each atom has associated therewith a time range and a frequency range in accordance with one embodiment. The mean spectral energy may be computed across the time-frequency atoms in the time dimension, and a histogram may be applied based on the computed mean spectral energy to determine an appropriate minimum spectral energy threshold adaptively to distinguish between detected signals and background noise in accordance with one embodiment. Determining the threshold in this manner may reduce or eliminate the need to monitor the background noise for an extended period of time (e.g., because the threshold is based on local energy within a time-frequency atom and not on global energy) and may allow the threshold to be adapted to changing environmental conditions in accordance with one embodiment.

Exemplary embodiments of the present disclosure allow for the detection of multiple signals received simultaneously, without regard for the bandwidth and/or center frequencies of the signals. Accordingly, multiple threats signals present at the same time may be detected in certain embodiments. Exemplary embodiments may also estimate various parameters or characteristics of the detected signals, such as bandwidth, center frequency, and beginning and ending time of the signals present in the monitored area. Various exemplary embodiments may perform these and/or other features in a computationally inexpensive and real-time or near real-time manner. The exemplary systems and methods disclosed herein may be useful in a variety of applications, including military and intelligence-based applications such as ELINT (electronic intelligence), COMINT (communications intelligence), electronic warfare systems, etc.

Exemplary embodiments of the present disclosure may enable detection of signals under unknown noise conditions. In such embodiments, no assumptions may be made regarding noise statistics that may be present in the received signals. Current signal detection techniques make an assumption of known noise statistics. In various signal detection situations (e.g., military operations), the noise statistics may be unknown. Various embodiments of the present disclosure are able to accurately detect the presence of signals with no a priori knowledge of the noise present in the received signals.

Figure 1:
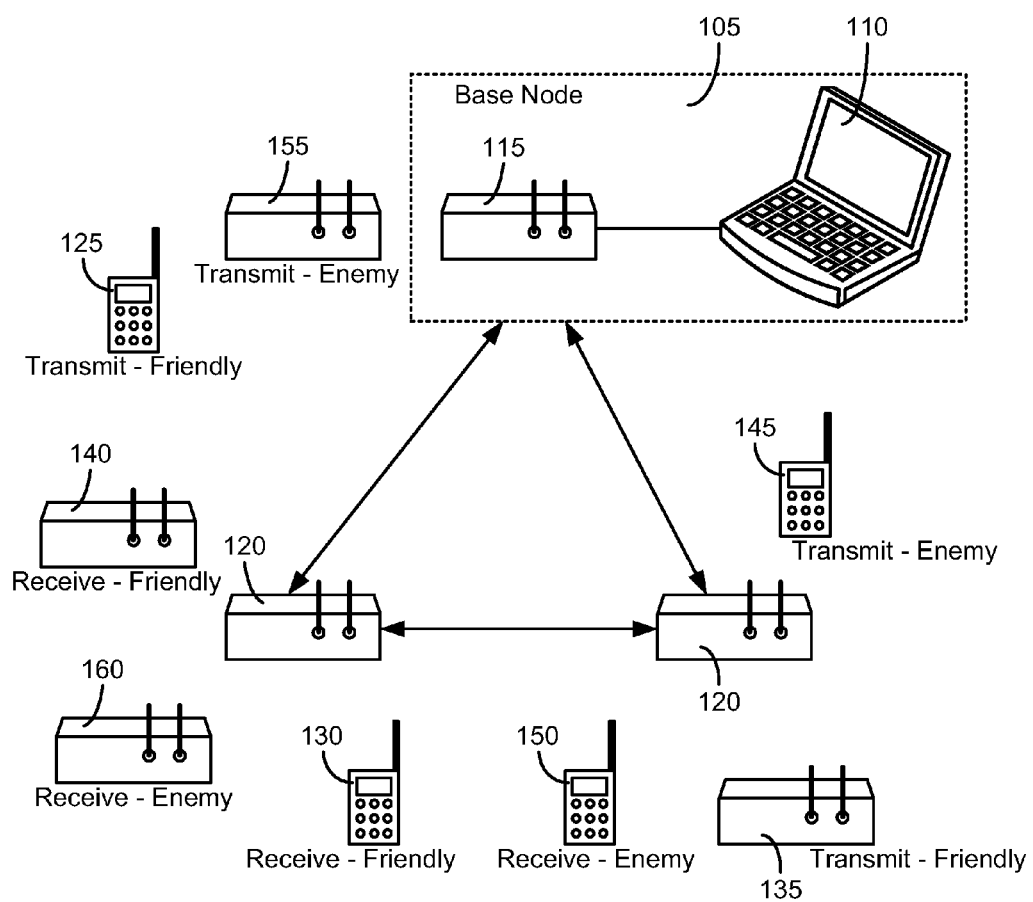
FIG. 1 is a diagram of a network of communication devices, including multiple friendly and enemy nodes, according to an exemplary embodiment.

Referring now to FIG. 1, is a diagram of a communications network 100 including various communication devices, including multiple friendly and enemy nodes, is shown according to an exemplary embodiment. Network 100 includes a base node 105 (e.g., a master node) that includes a base radio node 115 and a computing device 110 configured to exchange signals (e.g., data, control signals, etc.) with base radio node 115 and/or to control operation of base radio node 115. Computing device 110 may be connected to base radio node 115 via a wired (e.g., Ethernet, such as gigabit Ethernet, high-speed USB, etc.) or wireless (e.g., WiFi, Bluetooth, etc.) connection). Alternatively, nodes 115 and 110 can be an integrated unit. Network 100 may also include one or more nodes 120 (e.g., secondary radio nodes) that operate under the control or direction of base node 105. Base radio node 115 may be configured to communicate with nodes 120 via a wireless connection such as WiFi.

In some embodiments, base radio node 115 and/or nodes 120 may be or include Universal Software Radio Peripherals (USRPs). A USRP is a computer-hosted radio device configured to implement a software radio. A USRP may include one or more daughterboards configured to serve as a RF frontend for the USRP (e.g., perform modulation/demodulation and/or other functions needed to prepare signals for transmission to other nodes and/or convert signals received from other nodes), which may include a receiver, transmitter, transceiver, etc.

Network 100 may also include one or more other nodes that are configured to transmit and/or receive signals in network 100. For example, network 100 may include one or more friendly nodes, or nodes that are operated by entities that are cooperating with and/or do not pose a threat to the operator of base node 105. The friendly nodes may include nodes that are transmitting signals (e.g., nodes 125 and 135) and/or nodes that are receiving signals (e.g., nodes 130 and 140). The friendly nodes may also include nodes capable of transmitting audio, such as handheld radios (e.g., nodes 125 and 130), and/or nodes capable of transmitting audio, video, and/or other types of signals, such as USRPs (e.g., nodes 135 and 140).

Network 100 may also include one or more enemy or foe nodes, or nodes that are operated by entities that may be adverse to and/or may pose a threat to the operator of base node 105 and/or individuals/entities cooperating with the owner of base node 105. The enemy nodes may include nodes that are transmitting signals (e.g., nodes 145 and 155) and/or nodes that are receiving signals (e.g., nodes 150 and 160). The enemy nodes may also include nodes capable of transmitting audio, such as handheld radios (e.g., nodes 145 and 150), and/or nodes capable of transmitting audio, video, and/or other types of signals, such as USRPs (e.g., nodes 155 and 160).

Computing device 110 may work in conjunction with nodes 115 and/or 120 to perform various tasks in network 100. For example, computing device 110 may be configured to transmit and/or receive audio, video, and/or other types of data signals using base radio node 115. Computing device 110 may also use base radio node 115 and/or nodes 120 to scan for signals on one or more ranges of frequencies, to receive samples (e.g., intelligence data samples), to detect one or more signals, to classify received signals, to determine a geographic location associated with a source of the received signals, to determine if the received signals are from a friendly or enemy source, to optimize jamming parameters and/or choose a best node (e.g., among node 115 and nodes 120) for serving as a jamming node, to command the jamming node to jam enemy communication devices (e.g., block communication signals between those devices), and/or to perform other functions. In some embodiments, nodes 115 and/or 120 (e.g., USRPs) may be configured to cover a scanning and/or jamming frequency range of approximately 50 MHz to 2.2 GHz (e.g., using a wideband, or WBX, daughtercard).

Figure 2:
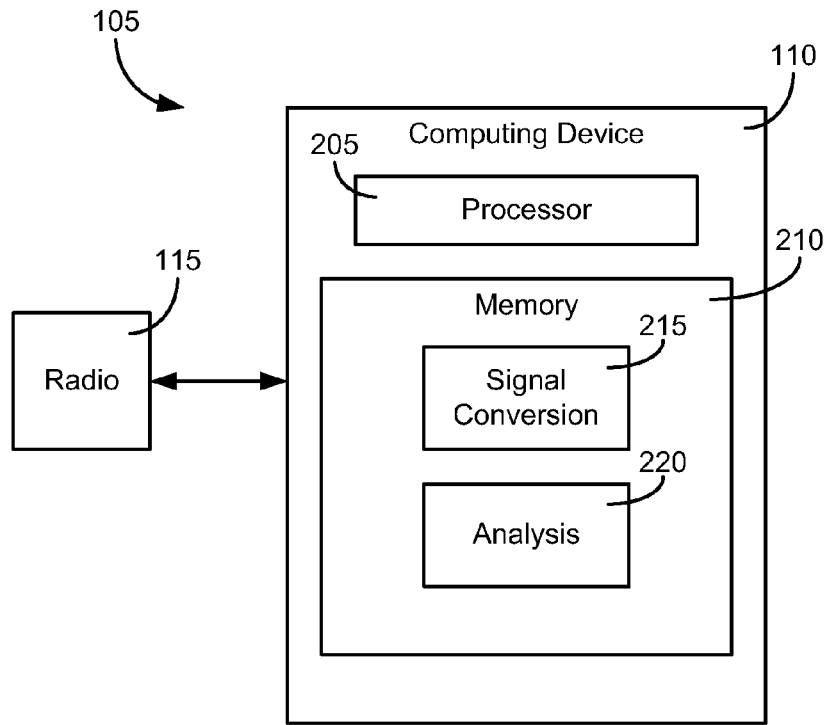
FIG. 2 is a block diagram of a base node configured to detect signals according to an exemplary embodiment.

Referring now to FIG. 2, a block diagram showing a more detailed view of base node 105 is shown according to an exemplary embodiment. In the illustrated embodiment, computing device 110 includes at least one processor 205, which may be any general purpose or special purpose processor (e.g., FPGA, CPLD, ASIC, etc.). Computing device 110 also includes a memory 210 that may be any type of computer or machine-readable media (e.g., hard drive, flash memory, ROM, RAM, EEPROM, CD, DVD, etc.). Computing device 110 may also include one or more wired and/or wireless input and/or output interfaces (e.g., Ethernet, USB, serial, Firewire, WiFi, Bluetooth, etc.) for receiving input data and/or outputting signals (e.g., for communicating with base radio node 115). In some embodiments, computing device 110 may be networked to one or more other processing circuits. In some embodiments, computing device 110 and one or more other processing circuits may be employed to perform various operations (e.g., in a distributed computing environment).

Memory 210 may be configured to store one or more modules having instructions that are executable by processor 205. For example, memory 210 may include a signal conversion module 215 configured to receive an input signal (e.g., from base radio node 115) and convert the received signal into one or more different representations. For example, in one embodiment, the received signal may initially be represented based on time and amplitude (e.g., energy), and signal conversion module 215 may be configured to convert the received signal into a two dimensional representation based on frequency and time, a three dimensional representation based on time, frequency, and energy, and/or another type of representation. Signal conversion module 215 may be configured to determine (e.g., partition, divide, split, etc.) one or more time-frequency partitions or atoms from a determined time-frequency representation of the received signal.

Memory 210 may also include an analysis module 220 configured to determine the presence of one or more signals within the received signal. Analysis module 220 may be configured to determine an energy level (e.g., a spectral energy) associated with each of the time-frequency atoms. Analysis module 220 may then use the determined energy levels to detect the presence of one or more signals within the received signals (e.g., by determining that the local energy level in one or more time-frequency atoms is above a minimum threshold).

Figure 3:
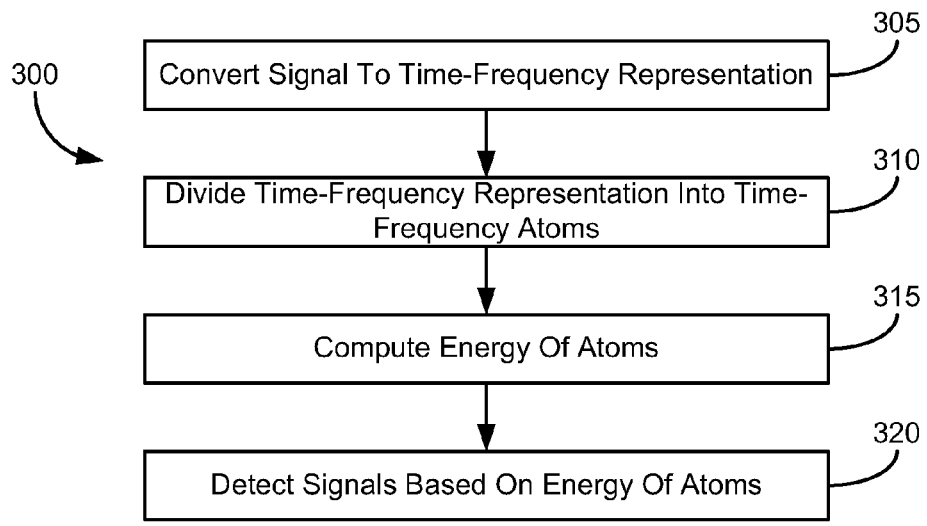
FIG. 3 is a flow diagram of a process for detecting signals according to an exemplary embodiment.

Referring now to FIG. 3, a flow diagram of a process 300 for detecting the presence of one or more signals within a received signals is shown according to an exemplary embodiments. In some embodiments, process 300 may be implemented via instructions stored in a memory (e.g., memory 210) and executed by a processor (e.g., processor 205). The instructions can be stored on a non-transitory medium for operation by processor 205.

At step 305, a signal is received and is converted to a time-frequency representation (e.g., an at least two dimensional representation in which data relating to the signal is represented using at least time and frequency). In some embodiments, a time-frequency representation may be determined by computing a spectrogram of the received signal. A spectrogram is a windowed Fourier transform that results in a two dimensional time-frequency representation of the received input signal. Because the received signal is represented in both time and frequency dimensions, multiple signals received and/or embedded within the received signal within a same or overlapping time or frequency range can be detected. Parameters of the detected signals, such as bandwidth, center frequency, time duration, etc. can also be determined.

At step 310, the time-frequency representation of the received signal may be partitioned or divided into a plurality of time-frequency atoms. The time-frequency atoms may be used to divide comparatively large, global time and frequency ranges of the received signal into a plurality of smaller, local time and frequency ranges. In various embodiments, the size of the time and/or frequency ranges associated with the atoms may be uniform or may vary in size. Each time-frequency atoms covers an area of the larger time and frequency ranges of the time-frequency representation for the received signal. The shape and/or area covered by the time-frequency atoms may vary in different embodiments. In one embodiment, each time-frequency atom may be rectangular in shape (e.g., when viewed in a graphical illustration of the time-frequency representation). For example, each time-frequency atom may have a beginning time, and ending time, a beginning frequency, and an ending frequency associated therewith, and these values may form vertices of a rectangular area of the atom, such that a first vertex is defined by the beginning frequency and the beginning time, a second vertex is defined by the beginning frequency and the ending time, a third vertex is defined by the ending frequency and the beginning time, and a fourth vertex is defined by the ending frequency and the ending time. In some embodiments, each atom may be referenced by a plurality of indices, including one or more frequency indices and one or more time indices. In various other embodiments, the time-frequency atoms may be configured in other forms or shapes (e.g., square, triangular, trapezoidal, etc.).

At step 315, an energy of each of the time-frequency atoms may be computed. The energy of each atom is determined based on the range of energies associated with the time and frequency ranges of the atom. In some embodiments, the energy associated with an atom may be assigned to be the maximum energy level of the received signal within the time and frequency parameters of the atom. In some embodiments, the energy assigned to the atom may be the minimum energy level of the received signal within the time-frequency atom. In other embodiments, the energy level attributed to the atom may be based on a combination of the range of energy levels within the time-frequency atom, such as a mean or an average of energy levels within the atom.

At step 320, one or more signals within the received signal are detected based on the energy of the atoms. A high energy level associated with a time-frequency atom may correspond to the presence of a signal within the received signal at or near the frequency at time parameters associated with the atom. A low energy level for a time-frequency atom may indicate the absence of a signal within the atom (e.g., may indicate the presence of background noise). In some embodiments, a threshold energy level may be determined for use in defining whether the energy of an atom represents a signal (e.g., if the energy level is above the threshold) or background noise (e.g., if the energy level is below the threshold). In some embodiments, once the signals have been detected, various parameters of the signals, such as center frequency, bandwidth, time duration, etc. may be determined as well. A report, message or other indication can be provided indicating the presence of signals and the type of source of the signal, (e.g., foe). In various embodiments, the determination of whether a type of source of the signal is a friend or foe may be based on the estimated signal parameters and/or a military communications plan and/or concept of employment for a given mission.

Figure 4:
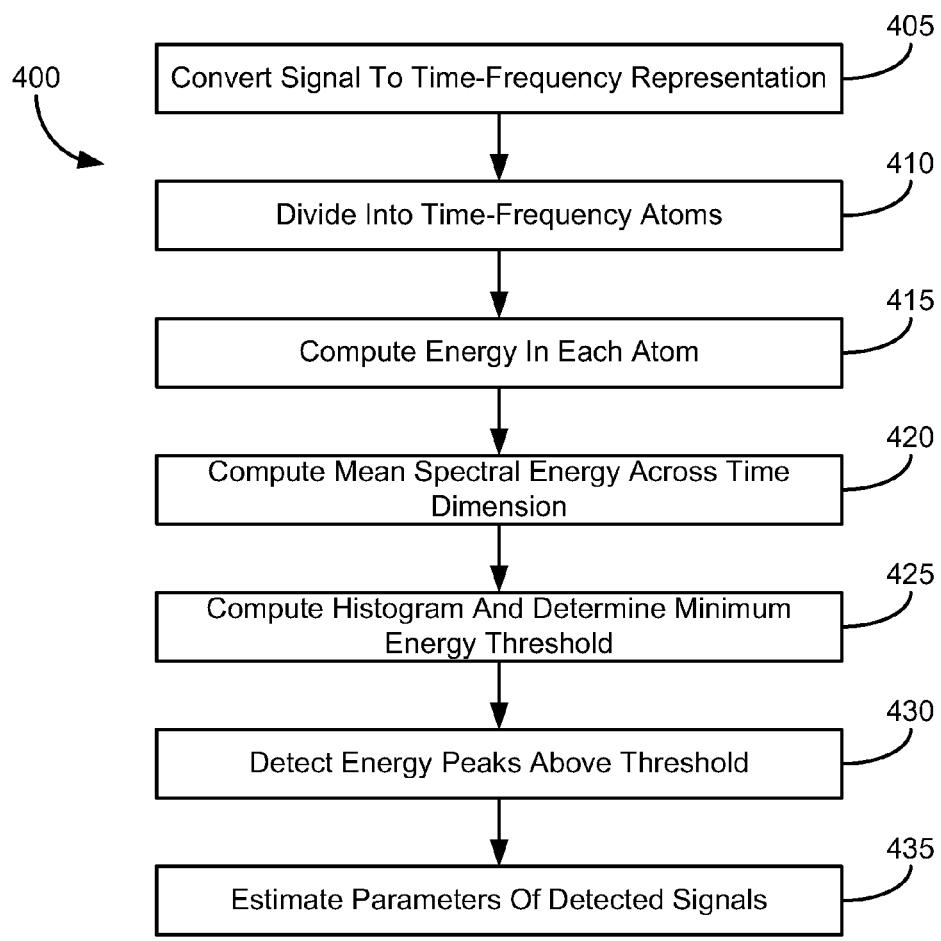
FIG. 4 is a flow diagram of a process for detecting signals according to another exemplary embodiment.

Referring now to FIG. 4, a flow diagram of another process 400 for detecting signals within a received signal is shown according to an exemplary embodiment. In some embodiments, process 400 may be implemented via instructions stored in a memory (e.g., memory 210) and executed by a processor (e.g., processor 205). The instructions can be stored on a non-transitory medium for execution by processor 205. In various embodiments, steps shown in FIG. 4 may be performed using one or more methods described above (e.g., with respect to FIG. 3).

Figure 5:
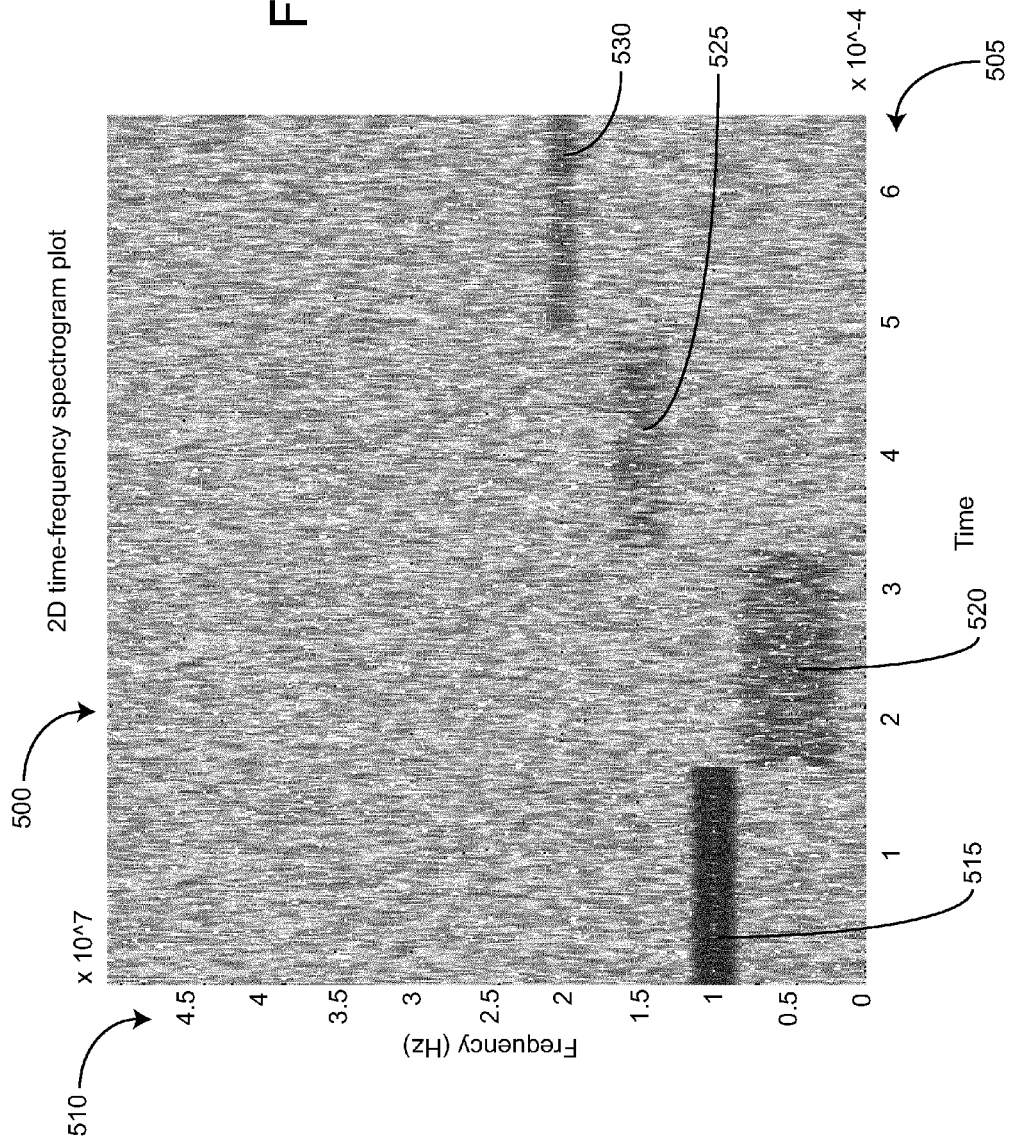
FIG. 5 is a time-frequency spectrogram plot of a received signal according to an exemplary embodiment.

At step 405, a received signal is converted to a time-frequency representation. FIG. 5 illustrates a two dimensional spectrogram plot 500 of a time-frequency representation of a particular received signal according to one exemplary embodiment. The horizontal or x-axis 505 of plot 500 represents time in units of $10^{-4}$ seconds (i.e., such that the units shown on the x-axis are 0.1 milliseconds, 0.2 ms, 0.3 ms, etc.). The vertical or y-axis 510 of plot 500 represents frequency in $10^7$ Hz (i.e., such that the units shown on the y-axis are 5 megahertz, 10 MHz, 15 MHz, etc.). Darker regions in plot 500 represent areas of higher energy, while lighter areas of plot 500 represent areas of lower energy. Most of plot 500 includes lighter, lower energy regions that represent background noise in the received signal. However, there are also four distinct, darker regions in spectrogram plot 500 that represent four signals 515, 520, 525, and 530 included within the received signal. In the illustrated embodiment, each of signals 515, 520, 525, and 530 occurs at a different frequency and a different time. In other embodiments, two or more signals within a received signal may overlap in frequency or in time. Because the received signal has been converted to a two dimensional time-frequency representation, two signals received simultaneously or during overlapping timeframes can both be detected.

Referring again to FIG. 4, once the received signal is converted to a time-frequency representation, the obtained time-frequency representation is then divided into two or more time-frequency atoms (step 410), and an energy (e.g., a spectral energy) of each of the time-frequency atoms is obtained (step 415). Dividing the time-frequency representation into atoms allows for a local energy to be determined for each atom, as opposed to a global energy for the signal over the full range of times and frequencies. In an exemplary embodiment, a signal may be detected in one atom having a first frequency index (e.g., associated with a first frequency or range of frequencies) and a first time index (e.g., associated with a first time or range of times), and a signal may be detected in another atom having a second frequency index and the same first time index, such that two signals received at the same time may be detected.

Figure 6:
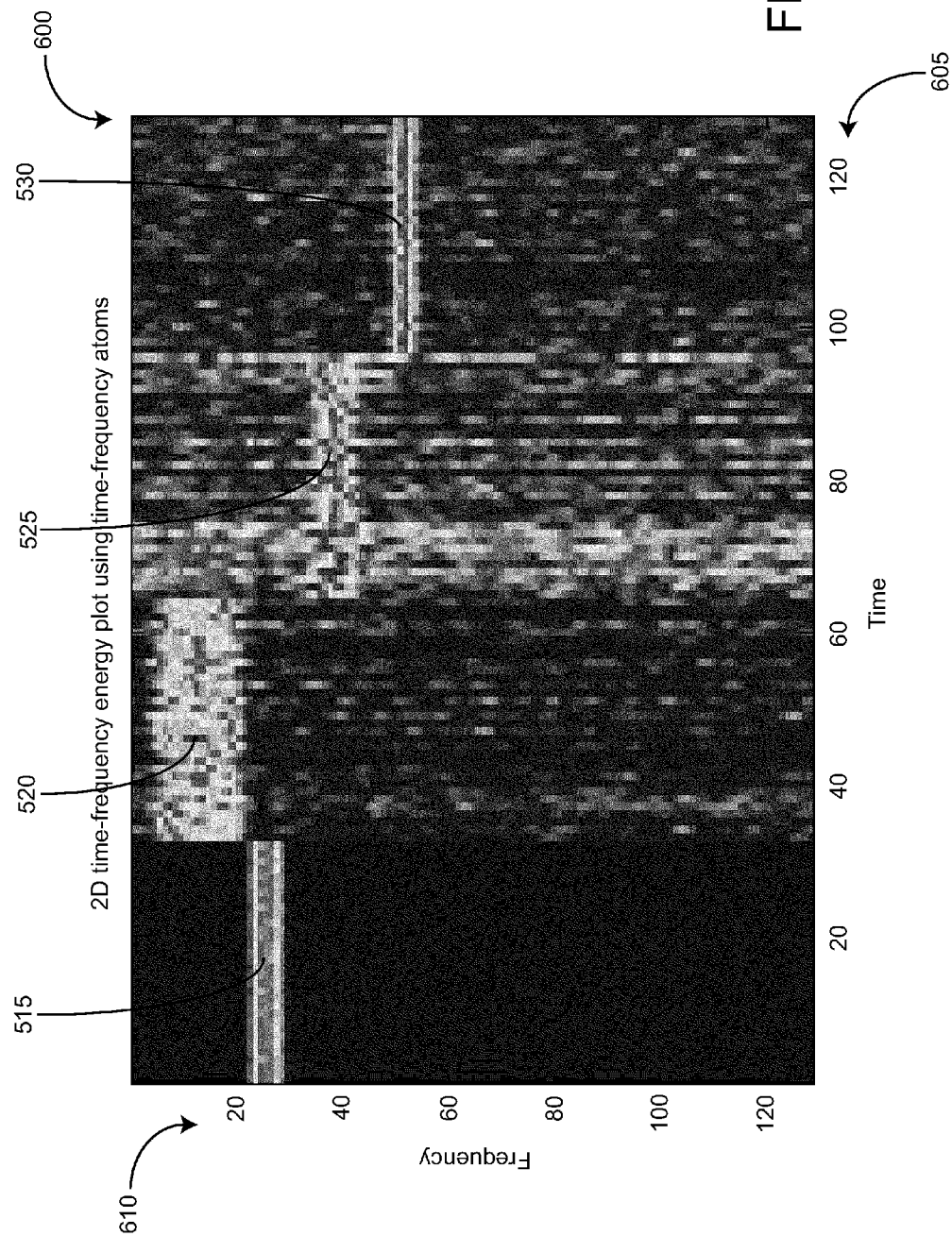
FIG. 6 is a time-frequency energy plot corresponding to the spectrogram plot of FIG. 5 and based on time-frequency atoms according to an exemplary embodiment.

FIG. 6 illustrates a time-frequency energy plot 600 using time-frequency atoms, or a time-frequency atom energy distribution plot, corresponding to spectrogram plot 500 of FIG. 5. The horizontal axis 605 of plot 600 represents a range of time indices for the time-frequency atoms. Each time index may represent a time or range of times associated with an atom. For example, if each atom is defined to span 10 μs, a first time index may represent a time from the beginning of the received signal (i.e., 0 μs) to 10 μs, a second time index may represent 10 μs to 20 μs, and so on. The vertical axis 610 of plot 600 represents a range of frequency indices for the time-frequency atoms. Each frequency index may represent a frequency or range of frequencies associated with an atom. For example, if each atom is defined to span 1 MHz, a first frequency index may represent a frequency range from 0 MHz to 1 MHz, a second frequency index may represents 1 MHz to 2 MHz, and so on.

In plot 600, four regions can be seen that are associated with signals 515, 520, 525, and 530. As shown in FIG. 5, the center frequency of signal 520 is at a lower frequency than the center frequency of signal 515. As shown in FIG. 6, the center frequency index associated with signal 520 is also lower than the center frequency index associated with signal 515. In some embodiments, the localized energy illustrated in a time-frequency atom energy distribution plot (e.g., plot 600) may more clearly illustrate (e.g., through contrast between atoms) the distinction between signals and background noise present in the received input signal (e.g., as compared to a non-atom based spectrogram such as plot 500).

Referring again to FIG. 4, once the energy of each of the time-frequency atoms is obtained, any signals included within the received signals may be detected. At step 420, a mean spectral energy distribution across a range of frequencies may be determined. To construct the mean spectral energy distribution, the energy of the received signal at each frequency index may be averaged over the range of time indices. Referring again to the illustration in FIG. 6, in some embodiments, constructing the mean energy distribution may be viewed as analogous to taking a horizontal slice across plot 600 for each frequency index and assigning that frequency index a mean energy that is equal to the average energy of the received signal across all the time indices in the horizontal slice. In some embodiments, the energy assigned to each frequency index may be different from the average energy (e.g., weighted average, maximum energy, etc.).

Figure 7:
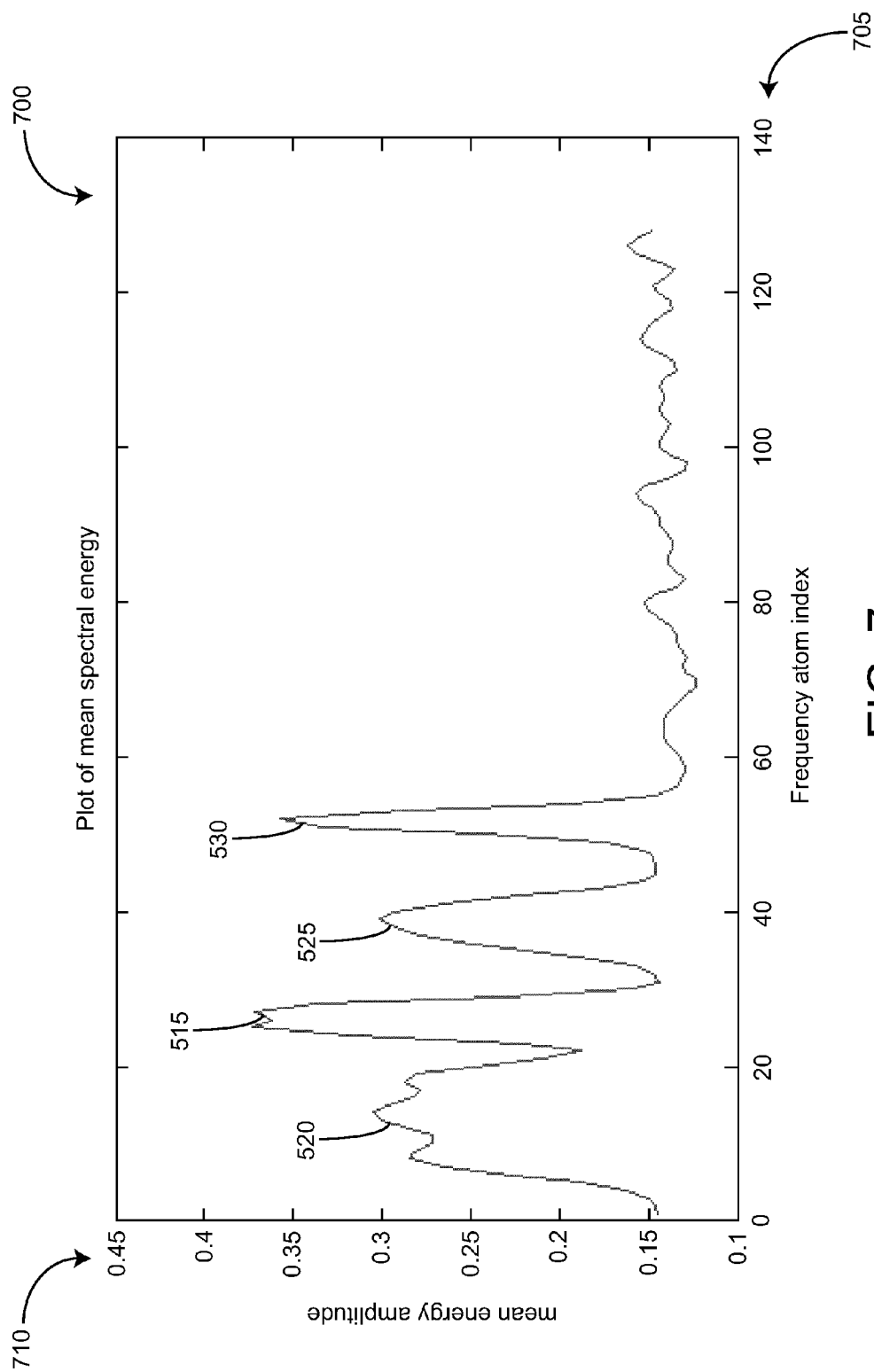
FIG. 7 is a mean spectral energy distribution plot generated based on the energy plot of FIG. 6 according to an exemplary embodiment.

FIG. 7 illustrates a mean spectral energy plot 700 corresponding to time-frequency atom-based plot 600 according to an exemplary embodiment. Horizontal axis 705 of plot 700 represents frequency indices of the atoms, and vertical axis 710 represents mean energy (e.g., the average amplitude of the received signal. Plot 700 is illustrated as having a relatively low mean energy level across many of the frequency indices, particularly the higher frequency indices (e.g., indices 60-130). These lower mean energy portions may represent background noise. Plot 700 also has several higher-energy peaks (see, e.g., frequency indices from 0 to 60) that may indicate the presence of signals within the received signal. For example, there are peaks around frequency index 15 (corresponding to signal 520), frequency index 25 (corresponding to signal 515), frequency index 40 (corresponding to signal 525), and frequency index 52 (corresponding to signal 530).

To distinguish between detected signals and background noise in the mean spectral energy distribution, an energy threshold may be used to define a minimum mean energy at which a signal is interpreted to exist within a frequency index or range of frequency indices (e.g., as opposed to frequency indices in which the signal is interpreted to be background noise). In some embodiments, the minimum energy threshold may be predefined (e.g., may be a constant and/or user-defined value within the computing device).

In other embodiments, an appropriate threshold may be determined using the mean spectral energy distribution. Referring again to FIG. 4, at step 425, the minimum energy threshold is determined by computing an energy probability distribution (e.g., represented in graphical form as a histogram) based on the mean energy values of the mean spectral energy distribution. The probability distribution may be formed by creating two or more bins of energy values, where each bin covers a range of mean energy values, based on the mean spectral energy distribution. The probability associated with each bin may be based on the number or percentage of times a frequency index in the mean spectral energy distribution had an associated mean energy value within the energy range of the bin. An appropriate threshold may then be determined based on the distribution of values or percentages within the bins. For example, it may be assumed that, if a bin includes a much larger percentage of values or amount of members than an adjacent bin associated with a higher range of energy values, the energy range associated with that bin is likely associated with background noise (e.g., assuming more of the time-frequency representation of the received signal is background noise than distinct signals). Determining the threshold based on the bin having the highest population may help statistically characterize the background noise and allow the threshold to be adapted based on changes in the background noise level.

Figure 8:
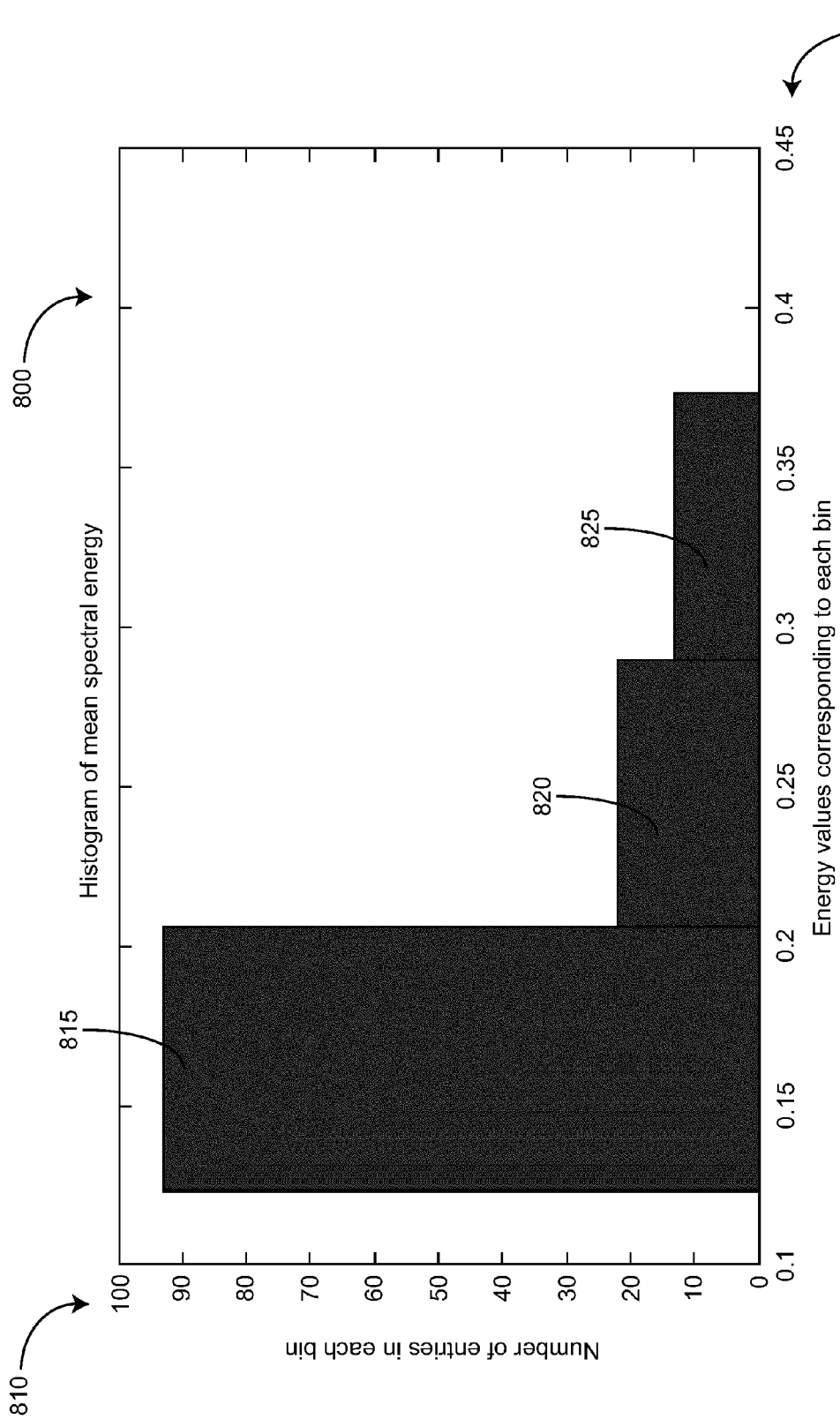
FIG. 8 is a histogram based on the spectral energy distribution plot of FIG. 7 according to an exemplary embodiment.

FIG. 8 illustrates a histogram 800 providing a graphical representation of a probability distribution associated with mean spectral energy plot 700 according to an exemplary embodiment. Horizontal axis 805 represents a range of mean energy values, and vertical axis 810 represents a number of entries in each bin (i.e., a number of frequency indices having a mean energy value falling within the energy range of the bin). Histogram 800 includes a bin 815 associated with energy values ranging from approximately 1.2 to 0.2, a bin 820 associated with energy values from approximately 0.2 to 0.29, and a bin 825 associated with energy values from approximately 0.29 to 0.375. Inspection of histogram 800 illustrates that there is a substantially greater number of entries in bin 815 than in bins 820 and 825. In one embodiment, it may be assumed that bin 815, having a lower energy value and a greater number of entries than the other bins, largely or entirely represents background noise, and the minimum energy threshold may be set to approximately 0.2 (e.g., the maximum energy value of bin 815 and minimum energy value of bin 820). In some embodiments, the system used to detect the signals may be configured to adapt or determine a size of the bins based on one or more training sets. For example the system may compare the results from the training sets to known properties of the signals and adjust the size of the bins and/or energy threshold to reduce any false positives in detected signals (e.g., by a threshold that is set too low) or missed signals (e.g., by a threshold that is set too high).

Referring again to FIG. 4, at step 430, signals within the received signal may be detected based on local peaks in energy within the mean spectral energy distribution. If a local peak in mean energy value across a range of frequency indices is located, and the energy value associated with the peak is above the determined minimum energy threshold, it may be determined that the peak represents a signal within the received signal, and the peak may be chosen as a detected signal. If a local peak is below the threshold, it may be determined that the peak represents background noise, and the peak may not be chosen as a detected signal. The number of chosen local peaks indicates the number of signals that are present within the received signal, and the locations (e.g., frequency indices) associated with the local peaks represent the center frequencies of the peaks.

Several closely located local peaks in the mean spectral energy distribution may represent a single signal rather than separate signals. In some embodiments, the locations (e.g., frequency indices) of the peaks may be examined to determine if the peaks are likely part of the same signal. This determination may be based on another threshold (e.g., a frequency range threshold) that defines a minimum frequency and/or frequency index difference between two peaks before the peaks are considered to be associated with separate signals. In various embodiments, the frequency range threshold may be predefined or may be adjusted based on application of training data sets. In some embodiments, if several peaks are determined to be associated with a single signal are determined to have a center frequency and energy level associated with the peak having the highest energy level. In other embodiments, the chosen peak may be a center peak in the frequency range.

Referring again to FIG. 7, seven local peaks above the background noise level appear in plot 700. A peak location module (e.g., part of an analysis module or a separate module) may be configured to determine that two or more of the peaks are in close enough proximity in frequency and/or energy level that they represent a single signal. For example, in one embodiment, peaks at frequency indices 16 and 22 may be ignored due to their proximity to the peak at frequency index 19. Further, the peak at approximately frequency index 26 may be ignored based on its proximity to the peak at frequency index 25. In such an embodiment, the seven peaks in plot 700 are interpreted to correspond to the four signals 515, 520, 525, and 530.

Referring again to FIG. 4, at step 435, one or more parameters of the detected signals may be calculated. As discussed above, the center frequencies of the detected signals can be determined using the mean spectral energy distribution. A time duration, including a beginning time and an ending time, for each detected signal may be determined using the time-frequency atom distribution (e.g., as shown in plot 600). The time indices of the time-frequency atom representation may be scanned for each determined signal center frequency to determine a time range where the energy value is at or near (e.g., within a particular threshold value) the energy value of the associated peak in the mean spectral energy distribution.

A bandwidth of each of the detected signals may also be determined based on the mean spectral energy distribution. Frequency indices may be searched (e.g., in both directions from the center frequency) until an energy level is found that is a predetermined value or percentage below the energy level at the center frequency. The search may start at the center peak and move in both directions, ending at the center frequency of the next peak. For the first peak, the search may be done until the beginning or lowest frequency in the mean spectral energy distribution vector is reached. For the last peak, the search may be performed until the end or highest frequency in the mean spectral energy distribution vector is reached.

In some embodiments, once the signals have been detected and/or one or more signal parameters have been calculated, output data may be provided based on the detected signals. For example, data may be provided to a user input device for display to a user. In some embodiments, the data may be provided to a signal classification module (e.g., part of the same computing device or a different computing device) and may be used to classify the detected signals (e.g., determine the type of signal, origin of signal, friendly or enemy, etc.). In various embodiments, output data may include the number of detected signals, their bandwidths, center frequencies, time duration, beginning time, end time, etc. A report can be provided with such information.

Figure 9:
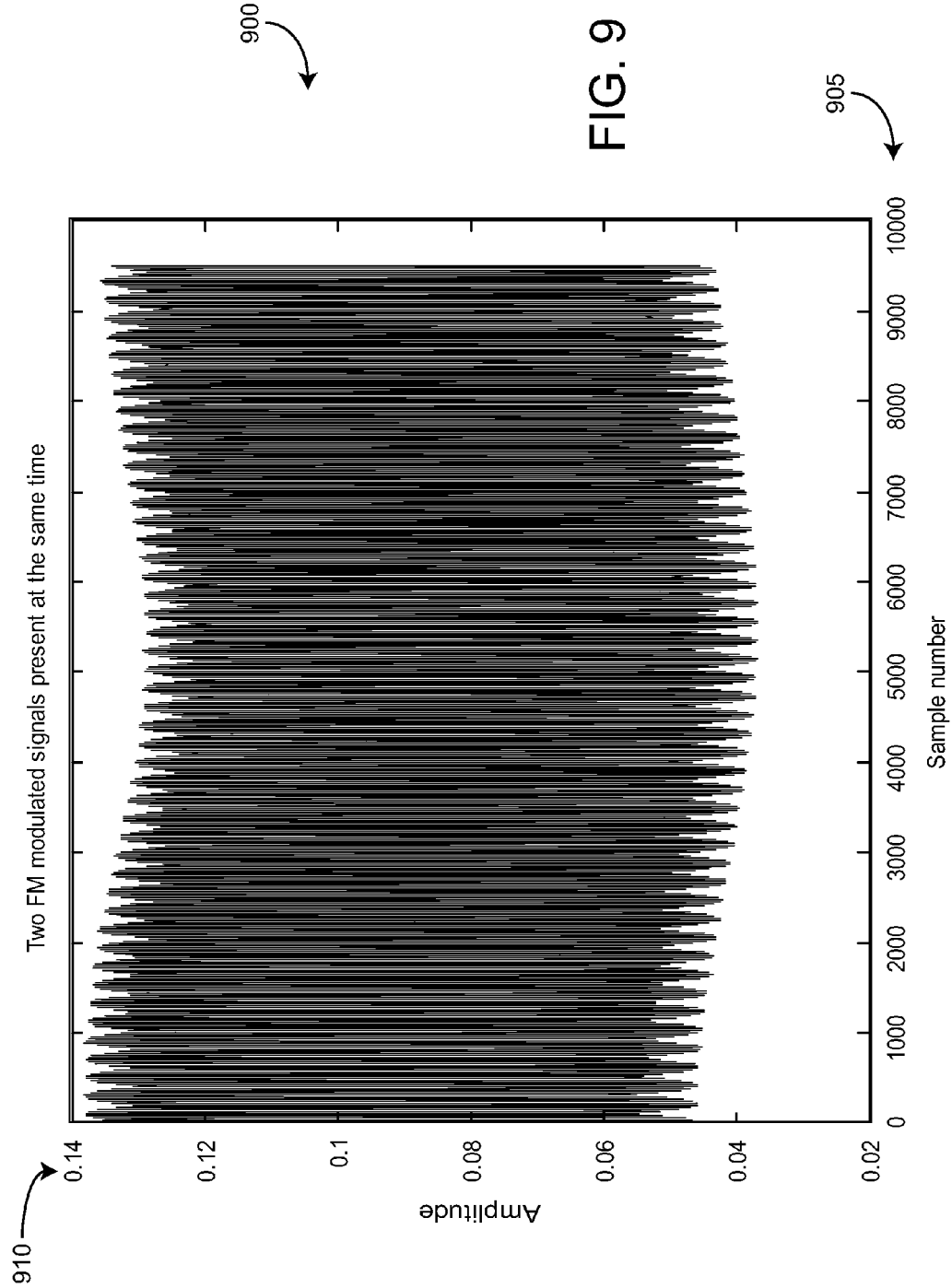
FIG. 9 is a graph illustrating a signal received by a base node that includes two signals transmitted from two separate radios simultaneously according to an exemplary embodiment.

Referring now to FIG. 9, a graph 900 illustrating a sample input signal received by a base node that includes two signals transmitted from two separate radios simultaneously is shown according to an exemplary embodiment. Horizontal axis 905 represents a sample number for a set of samples taken by the base node and is analogous to time. Vertical axis 910 represents an amplitude of the received signal. In the illustrated exemplary embodiment, the base node includes a USRP acting as a sensor node, and the two signals are generated by two transmitting nodes simultaneously transmitting in different frequency bands. The beginning time of each of the signals is 0.6554 ms and the ending time of each signal is 3.3 ms. The bandwidth of each signal is 25 gHz. The center frequency of the first signal is 462.6875 MHz, and the center frequency of the second signal is 467.7125 MHz.

Figure 10:
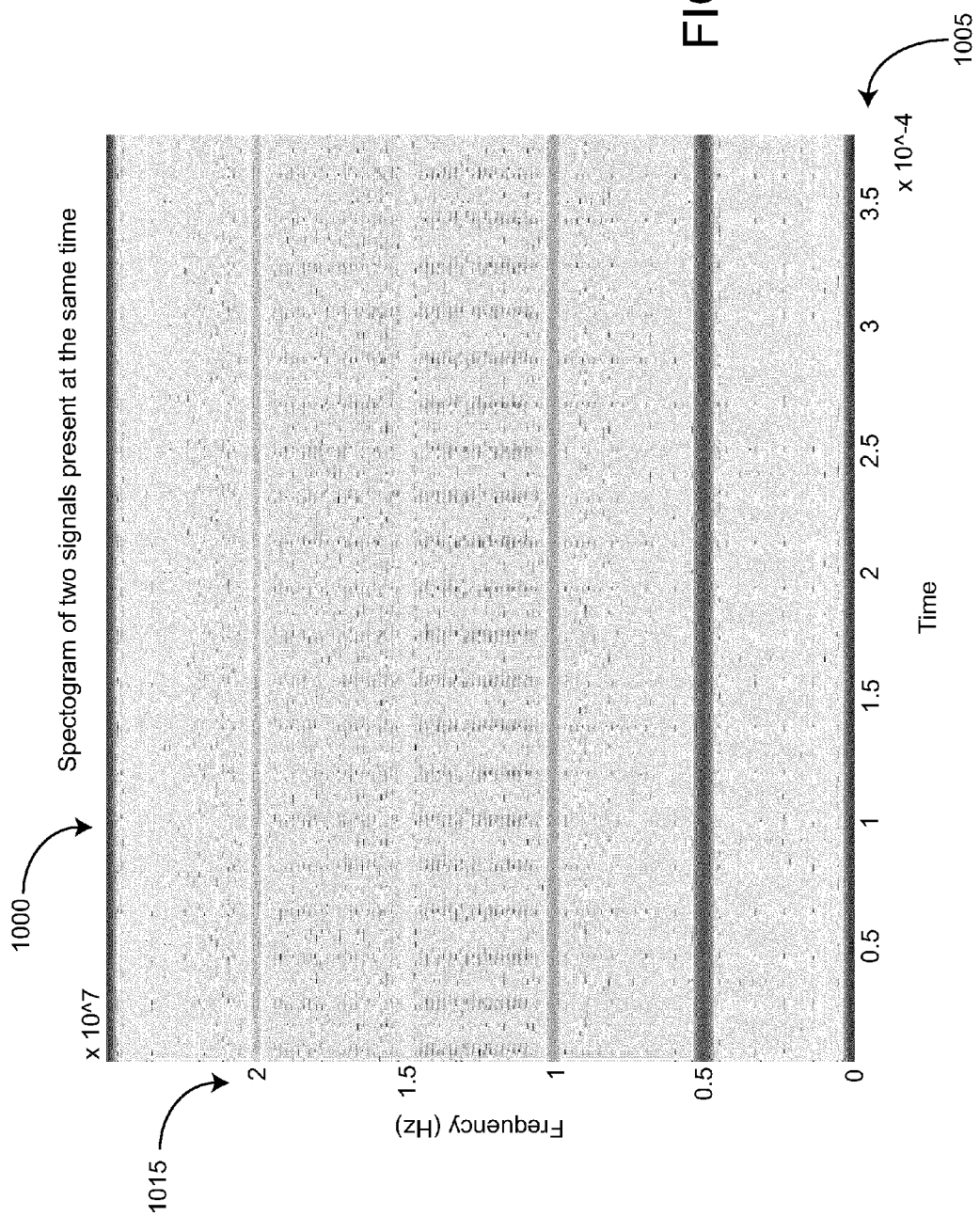
FIG. 10 is a time-frequency spectrogram plot corresponding to the received signal illustrated in FIG. 9 according to an exemplary embodiment.
Figure 11:
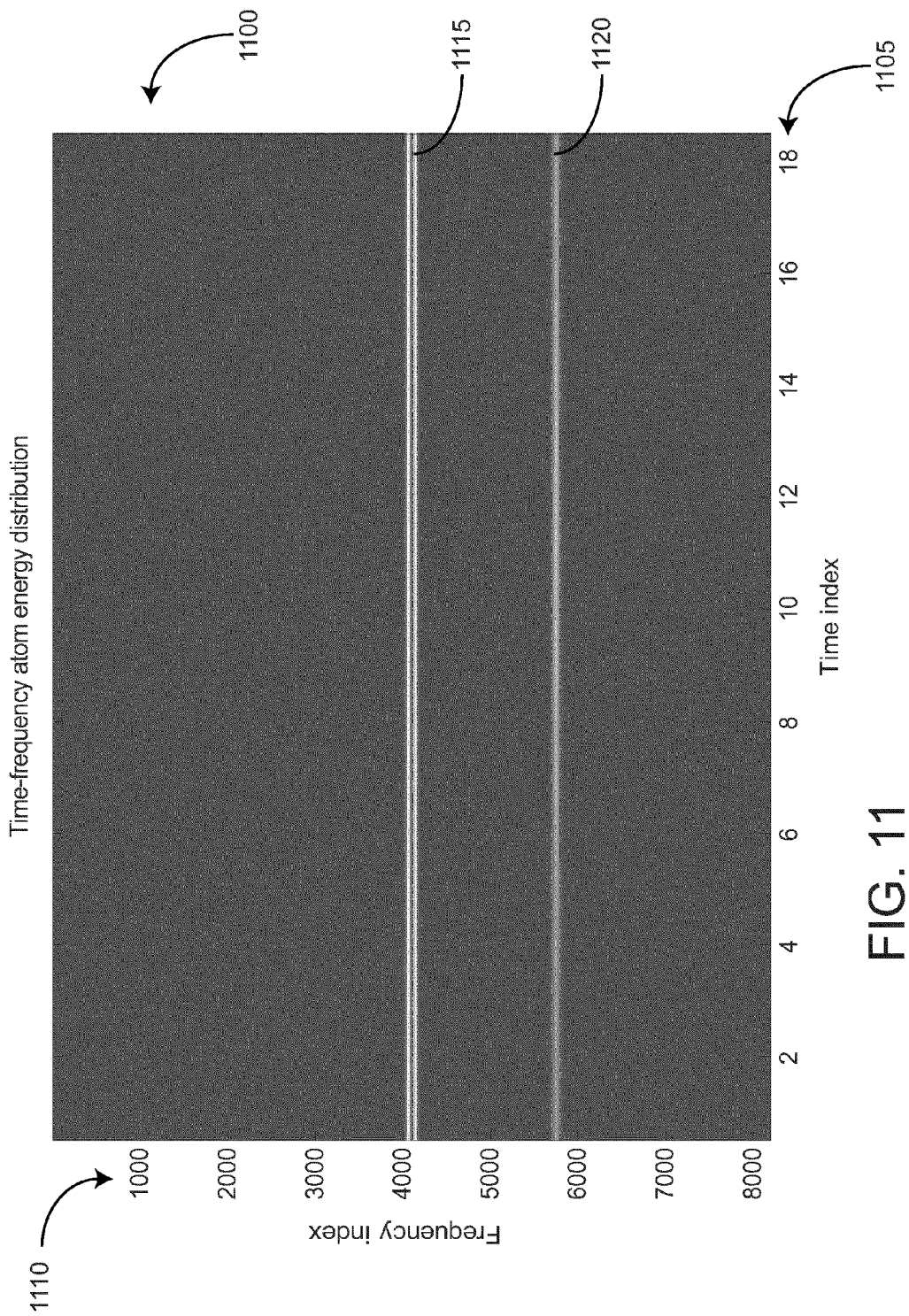
FIG. 11 is a time-frequency energy plot corresponding to the spectrogram plot of FIG. 10 and based on time-frequency atoms according to an exemplary embodiment.
Figure 12:
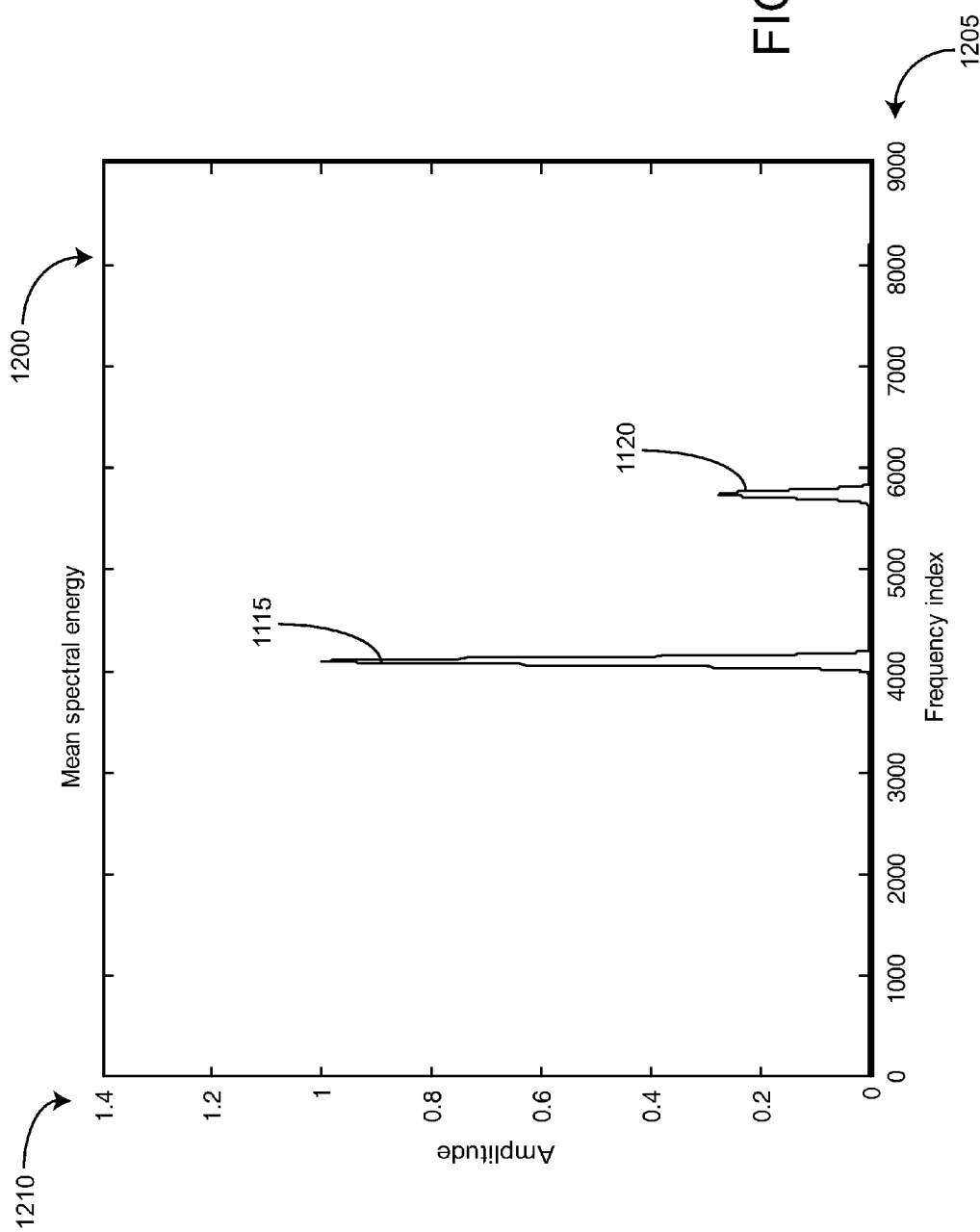
FIG. 12 is a mean spectral energy distribution plot generated based on the energy plot of FIG. 11 according to an exemplary embodiment.

FIGS. 10 and 11 illustrate a time-frequency spectrogram 1000 and time-frequency atom energy distribution plot 1100, respectively, associated with graph 900, according to exemplary embodiments. FIG. 12 illustrates a mean spectral energy distribution plot 1200 based on time-frequency atom energy distribution plot 1100. It can be seen, particularly in plots 1100 and 1200, that the system accurately detected two signals within the received signal. The actual detected center frequencies corresponding to the detected peaks in plot 1200 were 462.69 MHz and 467.71 MHz, which were very close to the listed actual frequencies for the transmitting nodes. The detected bandwidth for the signals was 23.651 kHz.

Figure 13:
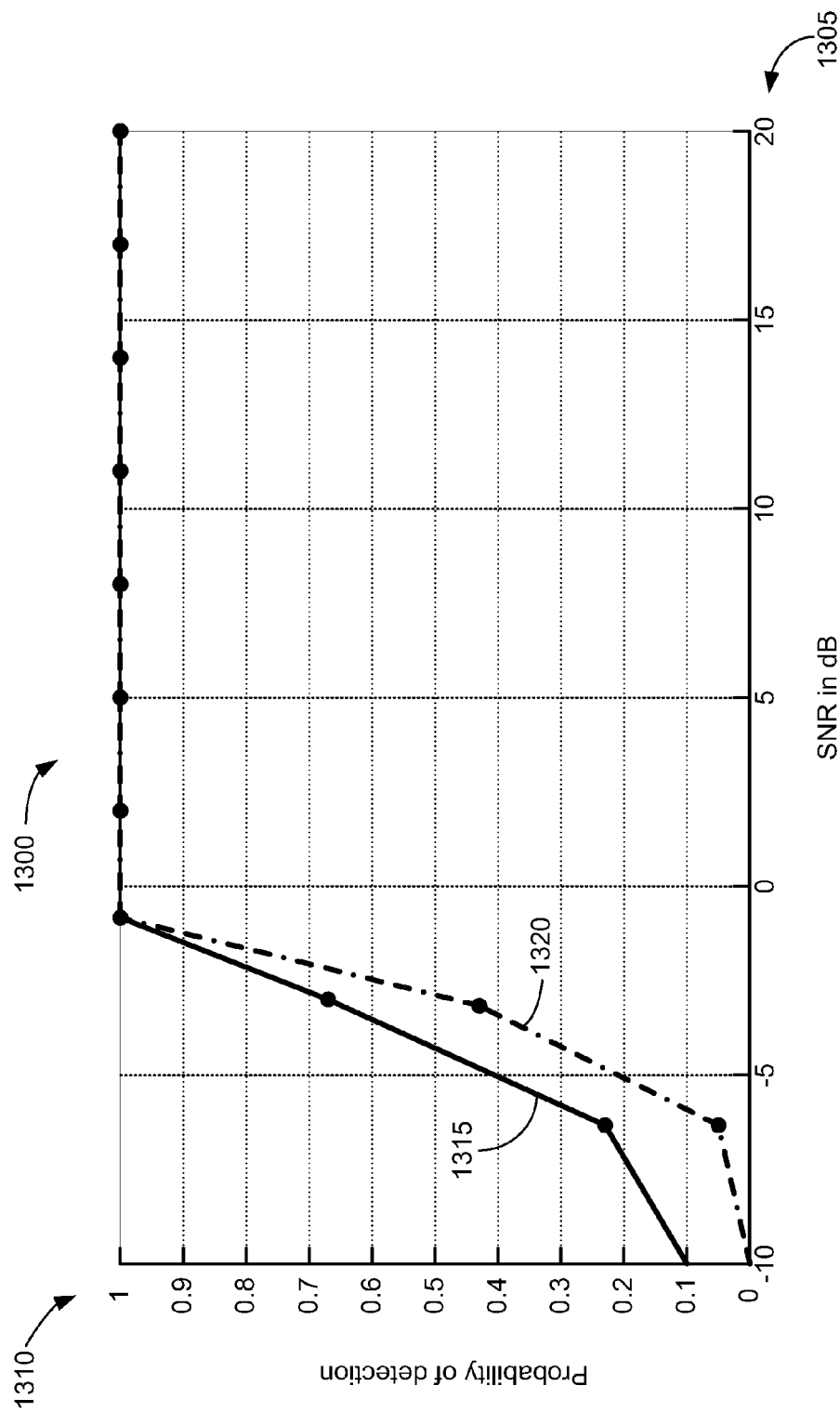
FIG. 13 is a graph illustrating performance of a two dimensional time-frequency-based signal detector as compared to a theoretically optimal matched filter detector according to an exemplary embodiment.

Referring now to FIG. 13, a graph 1300 illustrating the performance of a two dimensional time-frequency based signal detection system as compared to a theoretically optimal matched filter detector is shown according to an exemplary embodiment. The theoretically optimum matched filter detector is an optimum detector when the signal is completely known and the noise is white Gaussian noise. Under these optimal conditions, this is the best possible performance a signal detector can achieve. In such an optimum detector, a threshold value used to select whether a hypothesis signal is present or absent may be determined using the Neyman-Pearson method, which finds a threshold that minimizes the probability of miss for a given probability of false alarm. In the simulations underlying FIG. 13, simulated signals of different modulations were considered, and the probability of false alarm was fixed at 0.001. The simulations were run for 10,000 cycles. The probability of detection was computed by counting the number of times the matched filter detector correctly made the decision of signal present and dividing the total number of correct decisions by 10,000. The simulations were repeated for a range of signal to noise ratios (SNRs). The simulations were also repeated for a time-frequency based signal detection system (e.g., as disclosed herein according to various exemplary embodiments).

In graph 1300, the horizontal axis 1305 represents a SNR range and the vertical axis represents a probability of detection. Curve 1315 corresponds to the simulation results for the theoretically optimal matched filter detector and curve 1320 corresponds to the time-frequency based signal detection system. The performance of the time-frequency based detector, as can be seen in graph 1300, is very close to theoretically optimal performance, and is substantially the same as theoretical performance for SNRs>−1 dB.

The disclosure is described above with reference to drawings. These drawings illustrate certain details of specific embodiments that implement the systems and methods and programs of the present disclosure. However, describing the disclosure with drawings should not be construed as imposing on the disclosure any limitations that may be present in the drawings. The present disclosure contemplates methods, systems and program products on any machine-readable media for accomplishing its operations. The embodiments of the present disclosure may be implemented using an existing computer processor, or by a special purpose computer processor incorporated for this or another purpose or by a hardwired system. No claim element herein is to be construed under the provisions of 35 U.S.C. §112, sixth paragraph, unless the element is expressly recited using the phrase "means for." Furthermore, no element, component or method step in the present disclosure is intended to be dedicated to the public, regardless of whether the element, component or method step is explicitly recited in the claims.

As noted above, embodiments within the scope of the present disclosure include program products comprising machine-readable media for carrying or having machine-executable instructions or data structures stored thereon. Such machine-readable media can be any available media which can be accessed by a general purpose or special purpose computer or other machine with a processor. By way of example, such machine-readable media can comprise RAM, ROM, EPROM, EEPROM, CD ROM or other optical disk storage, magnetic disk storage or other magnetic storage devices, or any other medium (e.g., non-transitory medium) which can be used to carry or store desired program code in the form of machine-executable instructions or data structures and which can be accessed by a general purpose or special purpose computer or other machine with a processor. Combinations of the above are also included within the scope of machine-readable media. Machine-executable instructions comprise, for example, instructions and data which cause a general purpose computer, special purpose computer, or special purpose processing machine to perform a certain function or group of functions.

Embodiments of the disclosure are described in the general context of method steps which may be implemented in one embodiment by a program product including machine-executable instructions, such as program code, for example, in the form of program modules executed by machines in networked environments. Generally, program modules include routines, programs, objects, components, data structures, etc., that perform particular tasks or implement particular abstract data types. Machine-executable instructions, associated data structures, and program modules represent examples of program code for executing steps of the methods disclosed herein. The particular sequence of such executable instructions or associated data structures represent examples of corresponding acts for implementing the functions described in such steps.

Embodiments of the present disclosure may be practiced in a networked environment using logical connections to one or more remote computers having processors. Logical connections may include a local area network (LAN) and a wide area network (WAN) that are presented here by way of example and not limitation. Such networking environments are commonplace in office-wide or enterprise-wide computer networks, intranets and the Internet and may use a wide variety of different communication protocols. Those skilled in the art will appreciate that such network computing environments will typically encompass many types of computer system configurations, including personal computers, hand-held devices, multi-processor systems, microprocessor-based or programmable consumer electronics, network PCs, servers, minicomputers, mainframe computers, and the like. Embodiments of the disclosure may also be practiced in distributed computing environments where tasks are performed by local and remote processing devices that are linked (either by hardwired links, wireless links, or by a combination of hardwired or wireless links) through a communications network. In a distributed computing environment, program modules may be located in both local and remote memory storage devices.

An exemplary system for implementing the overall system or portions of the disclosure might include a general purpose computing device in the form of a computer, including a processing unit, a system memory, and a system bus that couples various system components including the system memory to the processing unit. The system memory may include read only memory (ROM) and random access memory (RAM). The computer may also include a magnetic hard disk drive for reading from and writing to a magnetic hard disk, a magnetic disk drive for reading from or writing to a removable magnetic disk, and an optical disk drive for reading from or writing to a removable optical disk such as a CD ROM or other optical media. The drives and their associated machine-readable media provide nonvolatile storage of machine-executable instructions, data structures, program modules, and other data for the computer.

It should be noted that although the flowcharts provided herein show a specific order of method steps, it is understood that the order of these steps may differ from what is depicted. Also two or more steps may be performed concurrently or with partial concurrence. Such variation will depend on the software and hardware systems chosen and on designer choice. It is understood that all such variations are within the scope of the disclosure. Likewise, software and web implementations of the present disclosure could be accomplished with standard programming techniques with rule based logic and other logic to accomplish the various database searching steps, correlation steps, comparison steps and decision steps. It should also be noted that the word "component" as used herein and in the claims is intended to encompass implementations using one or more lines of software code, and/or hardware implementations, and/or equipment for receiving manual inputs.

The foregoing description of embodiments of the disclosure have been presented for purposes of illustration and description. It is not intended to be exhaustive or to limit the disclosure to the precise form disclosed, and modifications and variations are possible in light of the above teachings or may be acquired from practice of the disclosure. The embodiments were chosen and described in order to explain the principals of the disclosure and its practical application to enable one skilled in the art to utilize the disclosure in various embodiments and with various modifications as are suited to the particular use contemplated.

What is claimed is:

1. A method of detecting signals, comprising:
   determining a time-frequency representation for a received signal;
   partitioning, using a computing device comprising at least one processor, the time-frequency representation of the received signal into a plurality of time-frequency partitions;
   determining, using the computing device, an energy level for each of the plurality of time-frequency partitions;
   dynamically determining, using the computing device, a minimum energy threshold based on a combination of the energy levels of the time-frequency partitions obtained from the time-frequency representation of the received signal; and
   detecting, using the computing device, one or more signals within the received signal based on the minimum energy threshold, wherein detecting the one or more signals comprises differentiating between the one or more signals and noise within the received signal based on the minimum energy threshold.

2. The method of claim 1, further comprising:
   calculating a mean spectral energy distribution for the time-frequency partitions across a range of frequencies; and
   estimating a probability distribution for one or more energy ranges based on the mean spectral energy distribution, wherein the probability distribution represents an estimated probability for each of the one or more energy ranges that the energy level of a time-frequency partition will fall within the respective energy range;
   wherein dynamically determining the minimum energy threshold based on a combination of the energy levels of the time-frequency partitions obtained from the time-frequency representation of the received signal comprises determining the minimum energy threshold based on the probability distribution.

3. The method of claim 2, wherein detecting the one or more signals within the received signal based on the minimum energy threshold comprises determining one or more local data peaks from the mean spectral energy distribution having an energy that is greater than the minimum energy threshold and identifying at least one of the one or more local data peaks as corresponding to a signal within the received signal.

4. The method of claim 3, wherein detecting the one or more signals within the received signal based on the minimum energy threshold comprises:
   determining that a plurality of the one or more local data peaks fall within a threshold frequency range; and
   determining that the plurality of local data peaks falling within the threshold frequency range all correspond to a single signal within the received signal.

5. The method of claim 3, further comprising determining a center frequency of a detected signal within the received signal based on a frequency associated with the corresponding local data peak.

6. The method of claim 5, further comprising determining a beginning time and an ending time of the detected signal based on a spectral energy distribution of the plurality of time-frequency partitions and the determined center frequency of the detected signal.

7. The method of claim 5, further comprising determining a bandwidth of the detected signal based on the center frequency and an energy level of the detected signal at the center frequency, wherein determining the bandwidth comprises searching adjacent frequencies to determine a lower frequency and a higher frequency each having an energy level that is a predetermined energy level below the energy level of the detected signal at the center frequency.

8. The method of claim 7, wherein the predetermined energy level is six decibels.

9. The method of claim 1, further comprising providing at least one of a number of detected signals in the received signal, bandwidths of the detected signals, center frequencies of the detected signals, beginning times of the detected signals, and ending times of the detected signals to a signal classification module configured to classify the detected signals.

10. The method of claim 1, wherein detecting the one or more signals within the received signal comprises detecting two or more signals within the received signal simultaneously.

11. A system for detecting signals, comprising:
    a signal conversion module configured to receive an input signal and calculate a time-frequency representation for the input signal, wherein the signal conversion module is configured to divide the time-frequency representation into a plurality of time-frequency atoms, each time-frequency atom having a frequency range and a time range associated therewith; and
    an analysis module configured to:
       determine a spectral energy level for each of the plurality of time-frequency atoms,
       dynamically determine a minimum energy threshold based on a combination of the spectral energy levels of the time-frequency atoms obtained from the time-frequency representation for the input signal, and
       detect one or more signals within the input signal based on the minimum energy threshold, wherein the analysis module is configured to differentiate between the one or more signals and noise within the input signal based on the minimum energy threshold.

12. The system of claim 11, wherein the analysis module is configured to:
    calculate a mean spectral energy distribution for the time-frequency atoms across a range of frequencies;
    estimate a probability distribution for one or more energy ranges based on the mean spectral energy distribution, wherein the probability distribution represents an estimated probability for each of the one or more energy ranges that the spectral energy level of a time-frequency atom will fall within the respective energy range; and determine the minimum energy threshold based on the probability distribution.

13. The system of claim 12, wherein the analysis module is configured to determine one or more local data peaks from the mean spectral energy distribution having a spectral energy level that is greater than the minimum energy threshold and to identify at least one of the one or more local data peaks as corresponding to a signal within the input signal.

14. The system of claim 13, wherein the analysis module is configured to determine that a plurality of the one or more local data peaks fall within a threshold frequency range and to determine that the plurality of local data peaks falling within the threshold frequency range all correspond to a single signal within the received signal.

15. The system of claim 12, wherein the analysis module is configured to determine a center frequency of a detected signal within the input signal based on a frequency associated with the corresponding local data peak.

16. The system of claim 15, wherein the analysis module is configured to determine a beginning time and an ending time of the detected signal based on a spectral energy distribution of the plurality of time-frequency partitions and the determined center frequency of the detected signal.

17. The system of claim 15, wherein the analysis module is configured to determine a bandwidth of the detected signal based on the center frequency and a spectral energy level of the detected signal at the center frequency, wherein determining the bandwidth comprises searching adjacent frequencies to determine a lower frequency and a higher frequency each having a spectral energy level that is a predetermined energy level below the spectral energy level of the detected signal at the center frequency.

18. The system of claim 17, wherein the predetermined energy level is six decibels.

19. The system of claim 11, further comprising a classification module configured to receive at least one of a number of detected signals in the received input signal, bandwidths of the detected signals, center frequencies of the detected signals, beginning times of the detected signals, and ending times of the detected signals from the analysis module, wherein the classification module is configured to classify the detected signals.

20. One or more non-transitory computer-readable media having instructions stored thereon that, when executed by a processor, are configured to perform a method of detecting signals, the method comprising:

determining a time-frequency representation for a received signal;

partitioning the time-frequency representation of the received signal into a plurality of time-frequency atoms;

determining a spectral energy for each of the plurality of time-frequency atoms;

calculating a mean spectral energy distribution for the time-frequency atoms across a range of frequencies;

estimating a probability distribution for one or more energy ranges based on the mean spectral energy distribution, wherein the probability distribution represents an estimated probability for each of the one or more energy ranges that the spectral energy of a time-frequency atom will fall within the respective energy range;

dynamically determining a minimum energy threshold based on the probability distribution; and detecting one or more signals within the received signal based on the minimum energy threshold.

21. The one or more non-transitory computer-readable media of claim 20, wherein detecting the one or more signals within the received signal based on the minimum energy threshold comprises determining one or more local data peaks from the mean spectral energy distribution having a spectral energy that is greater than the minimum energy threshold and identifying at least one of the one or more local data peaks as corresponding to a signal within the received signal.

* * * * *